(12) United States Patent
Ziglioli et al.

(10) Patent No.: US 10,879,143 B2
(45) Date of Patent: Dec. 29, 2020

(54) METHOD OF MANUFACTURING SEMICONDUCTOR DEVICES, CORRESPONDING DEVICE AND CIRCUIT

(71) Applicant: STMICROELECTRONICS S.R.L., Agrate Brianza (IT)

(72) Inventors: Federico Giovanni Ziglioli, Pozzo d'Adda (IT); Pierangelo Magni, Villasanta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/975,629

(22) Filed: May 9, 2018

(65) Prior Publication Data
US 2018/0342433 A1 Nov. 29, 2018

(30) Foreign Application Priority Data
May 23, 2017 (IT) .................. 102017000055942

(51) Int. Cl.
*H01L 23/31* (2006.01)
*H01L 21/48* (2006.01)
(Continued)

(52) U.S. Cl.
CPC ...... *H01L 23/3114* (2013.01); *H01L 21/4846* (2013.01); *H01L 21/4867* (2013.01);
(Continued)

(58) Field of Classification Search
None
See application file for complete search history.

(56) References Cited

U.S. PATENT DOCUMENTS

| 5,074,947 A | 12/1991 | Estes et al. |
| 5,237,130 A | 8/1993 | Kulesza et al. |

(Continued)

FOREIGN PATENT DOCUMENTS

| DE | 69027125 T2 | 11/1996 |
| DE | 69033817 T2 | 6/2002 |

(Continued)

OTHER PUBLICATIONS

Romain Cauchois et al., "Chip integration using inkjet-printed silver conductive tracks reinforced by electroless plating for flexible board packages", Micro/Nano-Electronics Packaging & Assembly, Design and Manufacturing Forum, Apr. 25-26, 2012, Grenoble, France, 7 pages.

(Continued)

*Primary Examiner* — Alexander G Ghyka
(74) *Attorney, Agent, or Firm* — Seed Intellectual Property Law Group LLP (57) ABSTRACT

A method of manufacturing semiconductor devices includes providing one or more semiconductor chips having a surface with electrical contact pads and a package mass encapsulating the semiconductor chip. The package mass includes a recessed portion leaving the semiconductor chip surface with the contact pads exposed, the recessed portion having a peripheral wall extending from the surface of the semiconductor chip to the outer surface of the package mass. Electrically-conductive formations are provided extending over the peripheral wall of the recessed portion with proximal ends electrically coupled with the contact pads of the semiconductor chip and distal ends at the outer surface of the package mass. The recessed portion is filled with a further package mass by leaving the distal ends of the electrically-conductive formations uncovered.

19 Claims, 11 Drawing Sheets

(51) Int. Cl.
*H01L 21/56* (2006.01)
*H01L 23/498* (2006.01)
*H01L 23/00* (2006.01)
*H01L 23/538* (2006.01)

(52) U.S. Cl.
CPC ...... *H01L 21/568* (2013.01); *H01L 23/49861* (2013.01); *H01L 23/49883* (2013.01); *H01L 23/5389* (2013.01); *H01L 24/19* (2013.01); *H01L 24/20* (2013.01); *H01L 24/96* (2013.01); *H01L 24/97* (2013.01); *H01L 21/561* (2013.01); *H01L 23/3135* (2013.01); *H01L 2224/04105* (2013.01); *H01L 2224/12105* (2013.01); *H01L 2224/16145* (2013.01); *H01L 2224/32145* (2013.01); *H01L 2224/32245* (2013.01); *H01L 2224/48145* (2013.01); *H01L 2224/73209* (2013.01); *H01L 2224/73227* (2013.01); *H01L 2224/73253* (2013.01); *H01L 2224/73265* (2013.01); *H01L 2224/73267* (2013.01); *H01L 2224/92244* (2013.01); *H01L 2924/1815* (2013.01); *H01L 2924/18162* (2013.01)

(56) References Cited

U.S. PATENT DOCUMENTS

| | | |
|---|---|---|
| 5,879,761 A | 3/1999 | Kulesza et al. |
| 6,064,217 A | 5/2000 | Smith |
| 6,483,186 B1 | 11/2002 | Hsieh et al. |
| 6,498,099 B1 | 12/2002 | McLellan et al. |
| 6,953,708 B2 | 10/2005 | Hedler et al. |
| 7,112,365 B2 | 9/2006 | Kliesch et al. |
| 7,291,380 B2 | 11/2007 | Nyholm et al. |
| 7,820,480 B2 | 10/2010 | Islam et al. |
| 8,841,779 B2 | 9/2014 | Pendse |
| 9,443,789 B2 | 9/2016 | Weatherspoon et al. |
| 9,847,317 B2 | 12/2017 | Yu et al. |
| 2002/0074672 A1 | 6/2002 | Huang et al. |
| 2003/0067750 A1 | 4/2003 | Garcia |
| 2003/0116861 A1 | 6/2003 | Jeung et al. |
| 2004/0042185 A1 | 3/2004 | Kung et al. |
| 2004/0155322 A1 | 8/2004 | Cho et al. |
| 2005/0032272 A1 | 2/2005 | Prather et al. |
| 2008/0001244 A1 | 1/2008 | Schwarzbauer |
| 2010/0013101 A1* | 1/2010 | Hedler ............. H01L 21/561 257/773 |
| 2010/0019370 A1 | 1/2010 | Pressel et al. |
| 2011/0241218 A1* | 10/2011 | Meyer ............. H01L 25/16 257/774 |
| 2014/0120263 A1 | 5/2014 | Yee et al. |
| 2015/0035164 A1 | 2/2015 | Ma et al. |
| 2015/0069621 A1 | 3/2015 | Weatherspoon et al. |
| 2015/0333023 A1* | 11/2015 | Beer ............. H01L 24/13 257/766 |
| 2015/0373834 A1* | 12/2015 | Engel ............. H05K 1/0216 361/783 |

FOREIGN PATENT DOCUMENTS

| | | |
|---|---|---|
| DE | 10239866 B3 | 4/2004 |
| DE | 102014110666 A1 | 1/2016 |
| EP | 0506859 B1 | 5/1996 |
| EP | 1089331 A2 | 4/2001 |
| EP | 0690490 B1 | 10/2001 |
| EP | 1518886 A1 | 3/2005 |
| WO | 9109419 A1 | 6/1991 |
| WO | 2005083785 A1 | 9/2005 |
| WO | 2005084163 A2 | 9/2005 |
| WO | 2015038250 A1 | 3/2015 |
| WO | 2016003588 A1 | 1/2016 |

OTHER PUBLICATIONS

Lars Boettcher et al., "Embedding of Chips for System in Package Realization—Technology and Applications", Impact, 2008 conference paper, Nov. 2008, 7 pages.

* cited by examiner

METHOD OF MANUFACTURING SEMICONDUCTOR DEVICES, CORRESPONDING DEVICE AND CIRCUIT

BACKGROUND

Technical Field

The description relates to semiconductor devices.

One or more embodiments may be applied to semiconductor devices, such as but not limited to, LGA (Land Grid Array), BGA (Ball Grid Array), QFN (Quad Flat No-lead) and routed QFN semiconductor devices.

Description of the Related Art

Semiconductor devices and related processes are an area of extensive research, as witnessed, e.g., by a high number of patent documents.

The following is a—purely exemplary and non-limiting—list of such documents:

US 2005/0032272 A1, WO 2005/084163 A2 (related to creating flip-chip conductive polymer bumps using photolithograpy and polishing), DE 69027125 D1, DE 69033817 D1, EP 0506859 A1, EP 0690490 A2, EP 1089331 A2, U.S. Pat. No. 5,074,947 A, U.S. Pat. No. 5,237,130 A, WO 1991/009419 A1 (concerning flip-chip bonding methods using electrically-conductive polymer bumps), U.S. Pat. No. 6,064,217 B1 (which describes a fine-pitch contact device employing a compliant conductive polymer bump), U.S. Pat. No. 5,879,761 A (which describes forming electrically-conductive polymer interconnects on electrical substrates), US 2002/0074672 A1 (which describes a semiconductor package without a substrate and a method of manufacturing same), U.S. Pat. No. 8,841,779 B2 (which describes a semiconductor device and method of forming high routing density BOL (bump-on-lead), BONL (bump-on-narrow-lead) and BONP (bump-on-narrow-pad) interconnect sites on a substrate), U.S. Pat. No. 6,498,099 B1 (which describes a leadless plastic chip carrier with etch back pad singulation), U.S. Pat. No. 7,820,480 B2 (which describes lead frame routed chip pads for semiconductor packages), U.S. Pat. No. 9,443,789 B1, US 2015/0069621 A1, WO 2015/038250 A1 (which describe embedded electronic packaging and associated methods), U.S. Pat. No. 7,291,380 B2 (which describes laser-enhanced plating for forming wiring patterns), and US 2014/0120263 A1 (which describes a process for electroless plating and a solution used for the same).

The paper by L. Boettcher, et al.: "Embedding of Chips for System in Package Realization—Technology and Applications", IMPACT, 2008 conference paper, November 2008 also provides some background for the discussion herein.

BRIEF SUMMARY

Despite the extensive activity in that area, a desire is still felt for semiconductor devices wherein the substrate can be removed for low pin count (e.g., for MEMS devices) and/or wherein the encapsulation molding compound (MC) can be used both for protecting the device and as a base for routing traces from pads to soldering lands.

One or more embodiments may relate to a corresponding device and a corresponding circuit.

In one or more embodiments, a semiconductor die or chip can be attached to a non-functional low-cost substrate (e.g., FR4, epoxy, polyimide, copper, aluminum). A resulting strip can be molded by leaving die and pads (at least partially) exposed by creating a step-wise arrangement on the walls of the cavity thus provided.

In one or more embodiments, routing from die pads (e.g., from a redistribution layer—RDL on top to the die) to lands on the external molding area can be created, e.g., by ink printing.

In one or more embodiments a secondary semiconductor die can be stacked on top of a first die and connections created with wire bonding or a flip-chip arrangement, with the cavity then possibly filled.

In one or more embodiments ball contacts can be provided in order to create a ball grid array—BGA.

One or more embodiments may offer one or more of the advantages presented in the following.

One or more semiconductor dice or chips can be attached on a non-functional low-cost substrate providing a (e.g., temporary) substrate permitting the dice to be handled during the assembly flow. Such a substrate may include a heat conductive foil (e.g., copper or aluminum) to provide thermal dissipation, with such a substrate adapted to be possibly left in place.

Lands on the package body or mass can be created, e.g., with ink printing with the possibility, in the case LDS (Laser Direct Structuring) materials, to replace ink printing with laser ablation plus plating.

Thinner and smaller packages can be provided by resorting to simple and cost-advantageous technologies, with the possibility of using economic solutions for providing bumping and/or the substrate.

BRIEF DESCRIPTION OF THE SEVERAL VIEWS OF THE DRAWINGS

One or more embodiments will now be described, by way of example only, with reference to the annexed figures, wherein.

It will be appreciated that, for the sake of clarity and ease of understanding, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference number 10 denotes a semiconductor device or package that includes a semiconductor die 12 having an active area having one or more electrical components, such as an integrated circuit.

Figure 1:
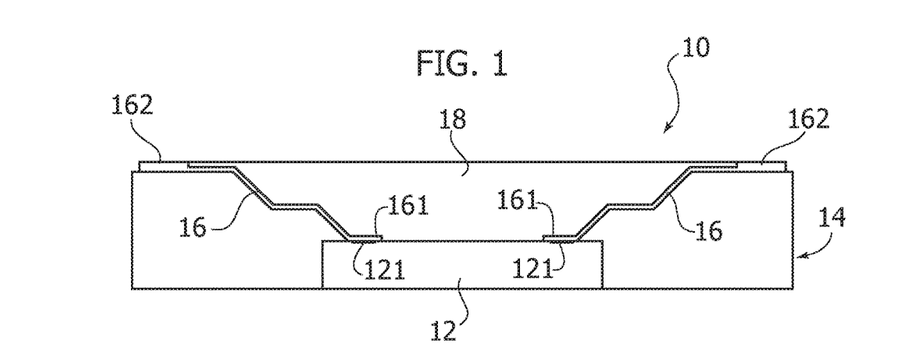
FIG. 1 is an exemplary cross-sectional view of a semiconductor device or package in accordance with one embodiment.
Figure 13:
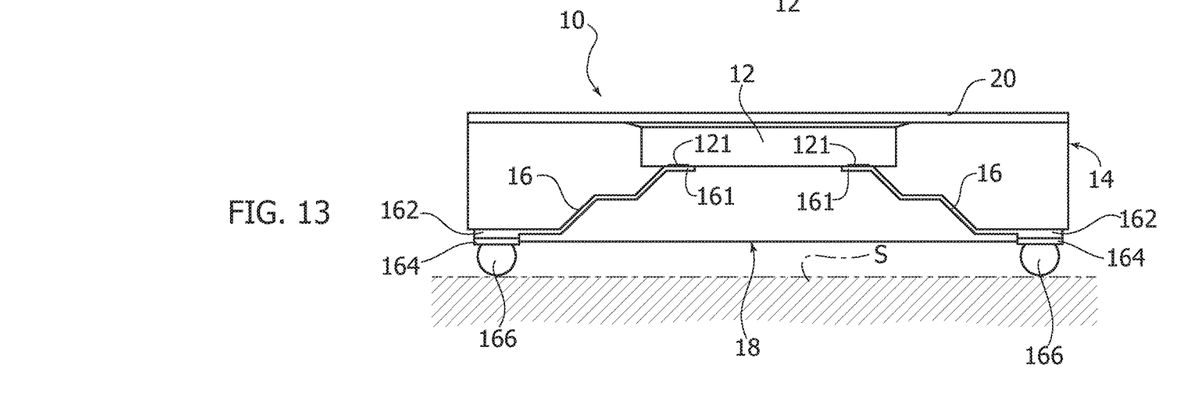
FIG. 13 illustrates a cross-sectional view of the device in FIG. 12 coupled to a substrate.
Figure 14:
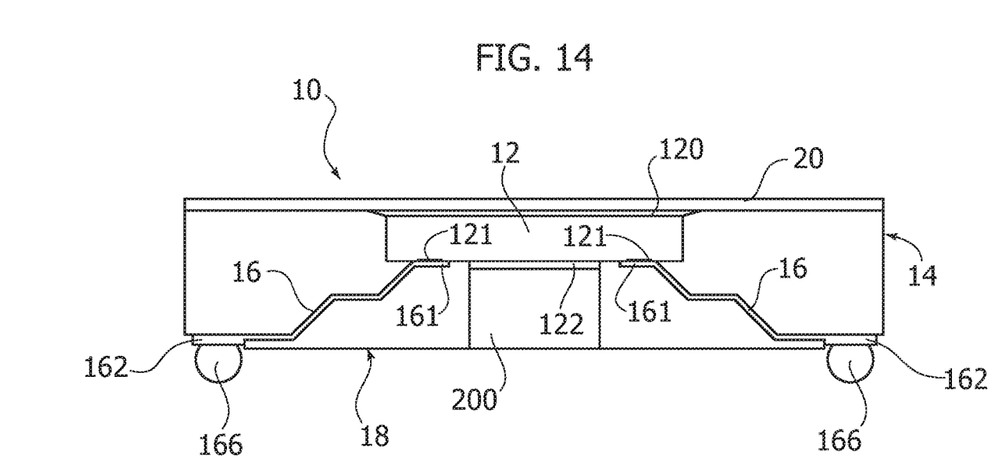
FIGS. 14 to 17 are cross-sectional views of exemplary semiconductor devices in accordance with various embodiments.

The semiconductor die or chip 12 is provided with a contact pads 121 at the active surface, which is an "upper" or "top" surface in FIG. 1, (hyphens take into account that—as exemplified in FIGS. 13 and 14—the device may be mounted with that surface facing downwards).

In one or more embodiments as exemplified in FIG. 1 the die or chip 12 is embedded in an (electrically insulating) package 14 molded onto the chip or die 12 by using, e.g., a package molding compound (PMC) of a known type, such as resin. As discussed below a laser direct structuring (LDS) material may be used for that purpose.

In one or more embodiments as exemplified in FIG. 1 the (primary) molded package 14 can be formed—in a manner known per se, e.g., by film-assisted molding—by leaving the upper or top surface of the die 12 exposed so that electrically-conductive formations can be formed thereon as shown at 16. These formations extend over the (e.g., stepped) walls of the cavity formed in the package 14 between inner or "proximal" end 161 coupled to the die pads 121 and external or "distal" ends 162 at the outer surface of the package 14.

In one or more embodiments an (e.g., Cu) redistribution layer (RDL) can be provided on the upper or top surface of the die 12. Such a layer may achieve a pad distribution which facilitates the assembly steps, e.g., by moving the pads towards the die center to facilitate film assisted molding and/or by varying (e.g., increasing) pad pitch and/or size.

In one or more embodiments as exemplified in FIG. 1 the upper or top surface of the die or chip 12 (left exposed/uncovered by the package 14) is covered by a secondary filling mass 18 (e.g., molding compound or resin encapsulation), so that the die or chip is completely encapsulated by leaving (just) the distal ends 162 of the formations 16 exposed at the package surface to permit electrical connection (signal and/or power supply) therewith. The secondary filling mass 18 may be different from or the same as the material used for the package 14.

FIGS. 2 to 12 are exemplary of possible steps for forming a semiconductor device 10 as exemplified in FIG. 1.

Figures 2, 3:
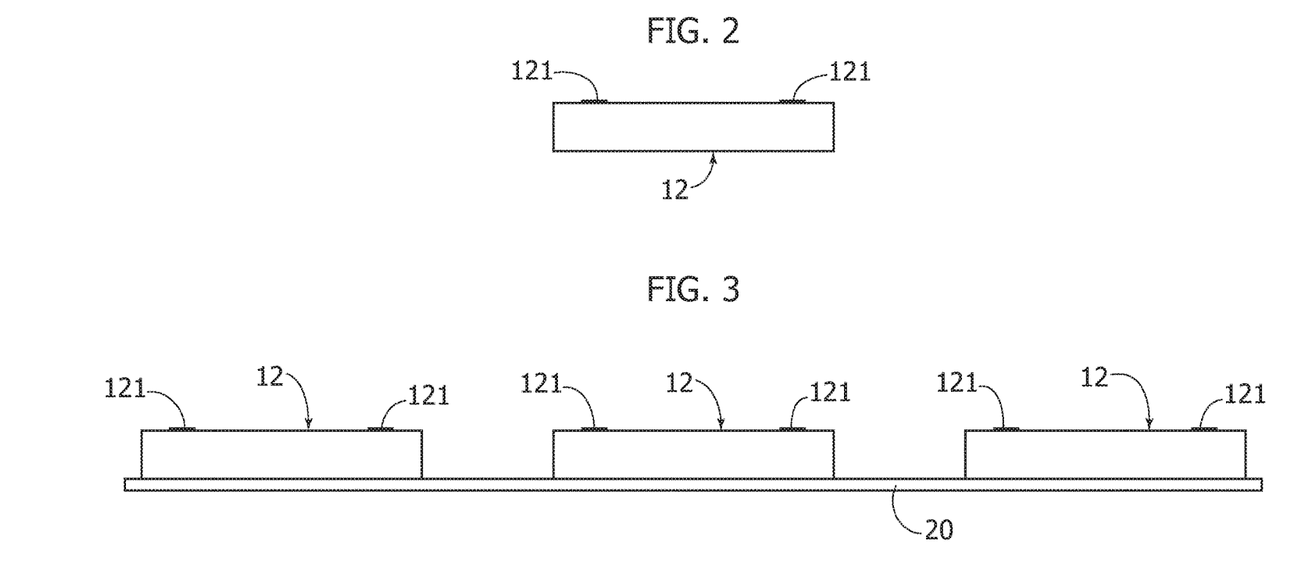
FIGS. 2 to 12 illustrate various stages of manufacturing of the semiconductor device or package of FIG. 1, with FIGS. 2 to 5 and 7 to 12 being cross-section view and FIG. 6 being a top down view of the semiconductor device as shown in FIG. 5.

FIG. 2 is exemplary of (one or more) dice or chips 12 having an active surface provided with contact pads 121 (e.g., a CU redistribution layer or RDL, such a feature being per se non-mandatory) at an upper or top surface thereof.

FIG. 3 is exemplary of the attachment of one or more dice or chips 12 as discussed previously onto a (possibly temporary) support layer 20. This may be a low-cost substrate (e.g., paper, FR4, epoxy, polyimide, copper, aluminum) intended to act as a carrier to permit handling of the die/dice or chip/chips 12 during subsequent processing steps as discussed in the following. In one or more embodiments the substrate 20 may include thermally conductive material (e.g., metal such a copper or aluminum) when thermal dissipation capability is desirable.

Figure 4:
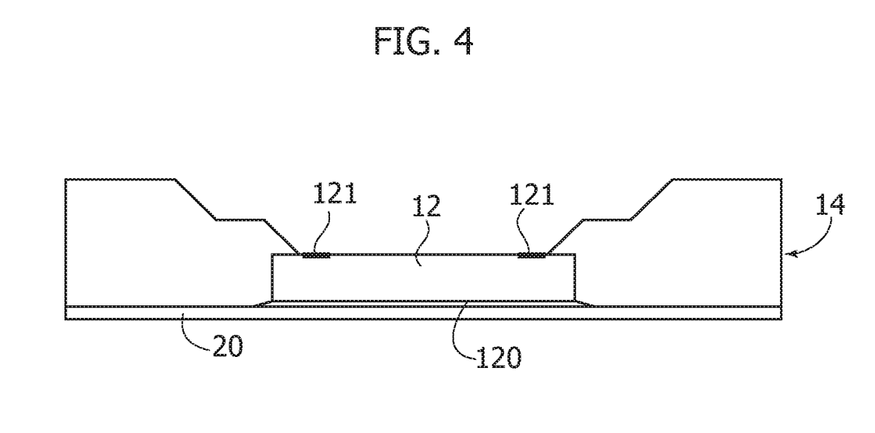

FIG. 4 is exemplary of the provision of the (first) package 14 molded onto the die or chip 12 by leaving the upper surface (including the contact pads 121) exposed at the bottom of a sort of a cavity or "pit" formed around the upper or top surface of the chip or die 12.

In one or more embodiments as exemplified in FIG. 4 the (flared) peripheral walls of such a recessed portion of the package 14 may be step-wise, e.g., including one, two (or more) steps.

Figure 5:
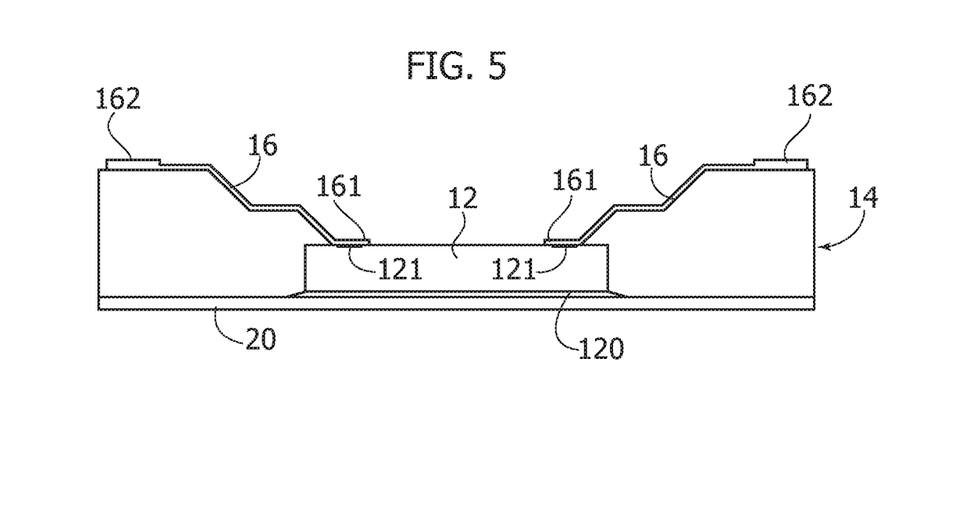
Figure 6:
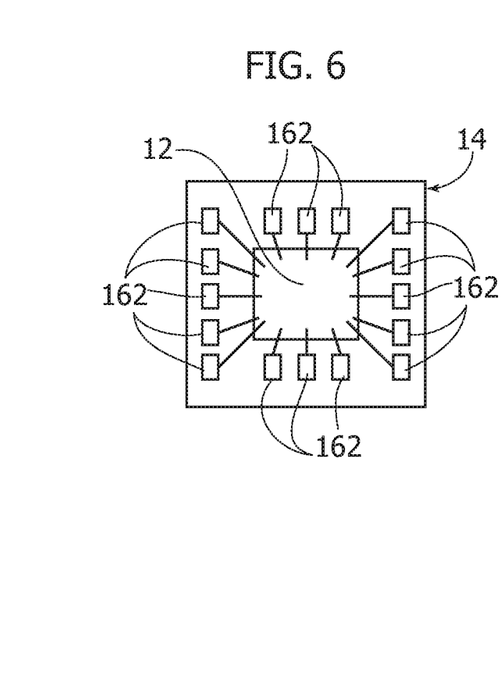

FIG. 5 is exemplary of the provision onto the walls of the recessed portion of the package of (e.g., ink-printed) electrically-conductive formations 16 including, e.g., tracks or traces extending radially with respect to the semiconductor die or chip 12 (see, e.g., the plan view of FIG. 6) with proximal and distal end pads 161, 162, respectively.

Ink-printing electrically-conductive formations is an established technology as witnessed, e.g., by R. Cauchois, et al.: "Chip integration using inkjet-printed silver conductive tracks reinforced by electroless plating for exible board packages", MiNaPAD 2012. Micro/Nano-Electronics Packaging & Assembly, Design and Manufacturing Forum, April 2012, Grenoble, France. pp. F01, 2012, which is incorporated herein by reference.

The captioned article discloses providing ink-printed traces followed by bumping or using traces for connecting die pads without however mentioning a complete package. Reference is also made to an organic substrate onto which the traces are printed.

One or more embodiments make it possible to dispense with such a substrate, e.g., by providing a substrate-less package.

One or more embodiments may involve ink printing taking place in a recessed portion provided as a result of, e.g., film-assisted molding, by leaving the pads exposed at a window in the die which is partially embedded in the package resin.

One or more embodiments providing the electrically-conductive formations 16 may involve laser activation plus plating by using a laser activatable resin (e.g., LCP o epoxy with fillers).

Reference number 120 in FIGS. 4 and 5 indicates a die attachment layer between the die or chip 12 and the substrate 20, but such an attachment layer is not visible in FIG. 3.

Figure 7:
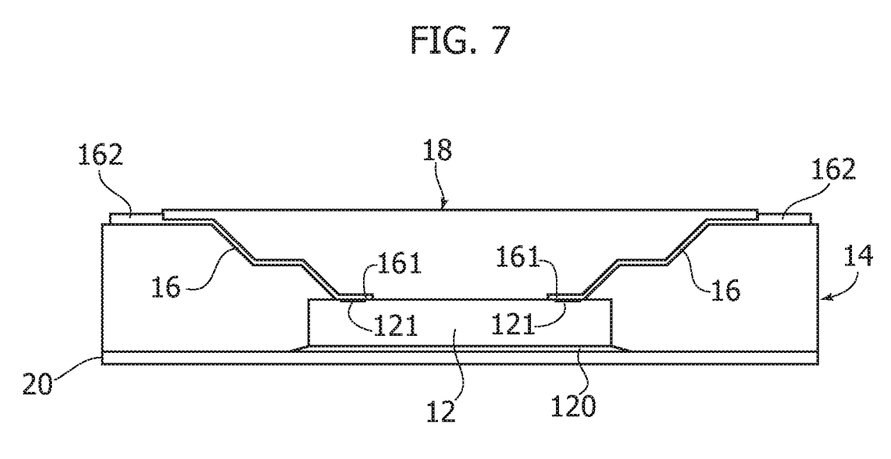

FIG. 7 is exemplary of the provision of the secondary package mass 18.

In one or more embodiments this may involve filling the recessed portion or cavity in the primary package 14 with, e.g., liquid encapsulant which is then solidified (e.g., by curing).

Figure 8:
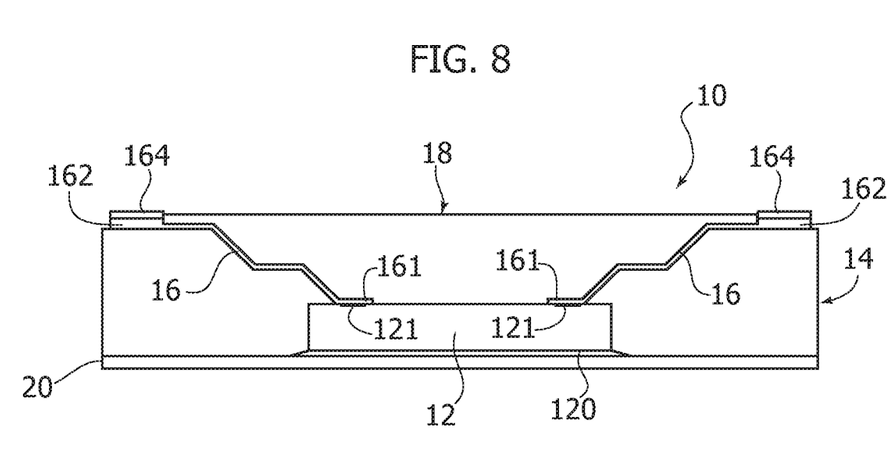
Figure 9:
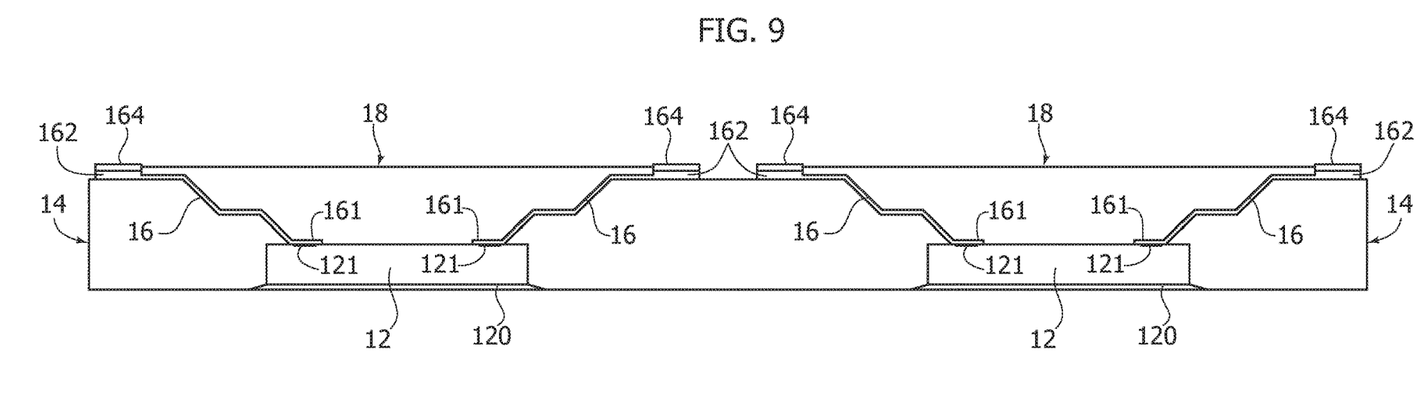

FIG. 8 is exemplary of the possible formation of plating lands 164 (according to known technologies) over the distal ends 162 of the electrically-conductive formations 16.

Figure 10:
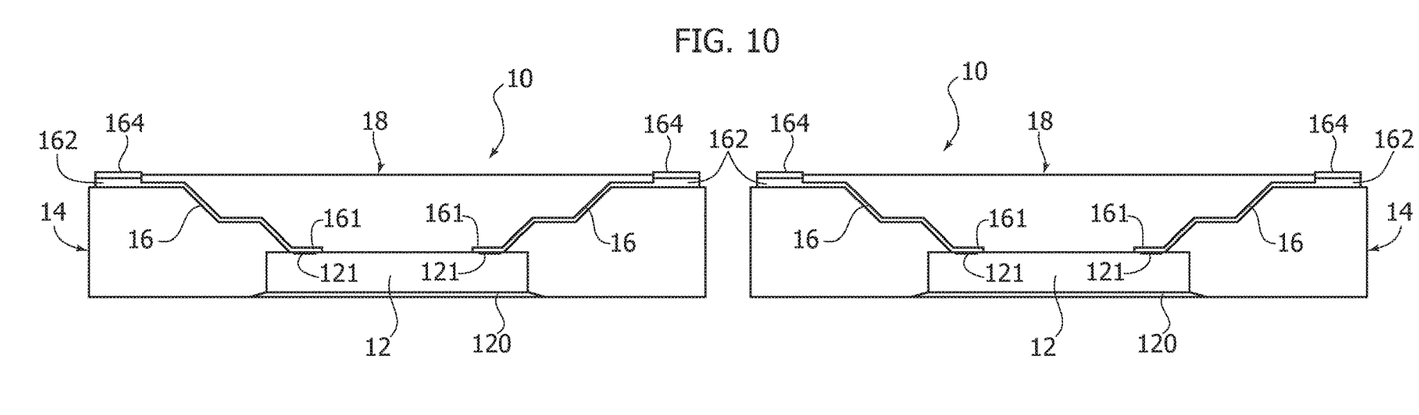

FIG. 9 is again exemplary of the possibility of performing the acts discussed in the foregoing on a plurality of dice or chips 12 arranged on a common substrate 20, which (when not left in place, e.g., to facilitate thermal dissipation) can be removed as shown in FIGS. 9 and 10.

FIG. 10 is exemplary of a singulation step aiming at separating the individual circuits 10 resulting from the steps discussed previously.

Figure 11:
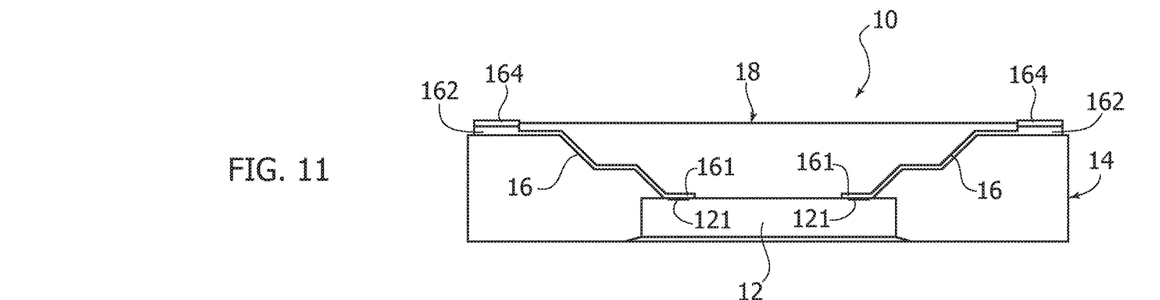
Figure 12:
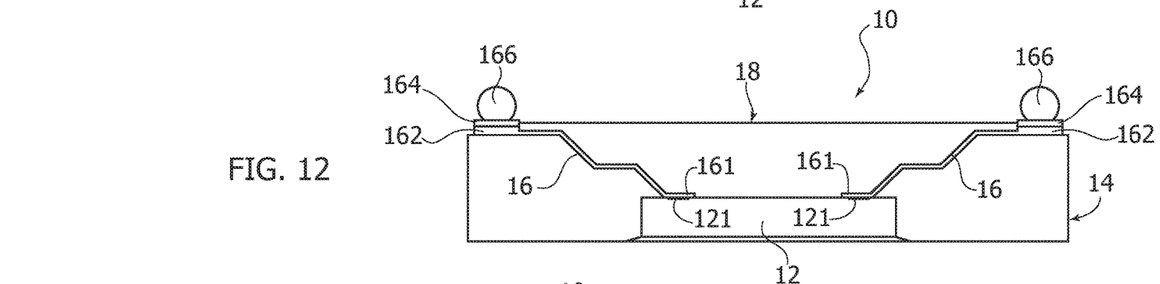

FIGS. 11 and 12 are exemplary of a device structure as discussed previously being suited to be provided both as a QFN (Quad Flat No-lead) or LGA (Land Grid Array) arrangement or as a BGA (Ball Grid Array) arrangement provided with contact balls 166 arranged (possibly over the plating 164 at the distal ends 162 of the electrically-conductive formations 16. For BGA a printed layer of solder mask can be used to better define solder ball openings.

FIG. 13 is exemplary of the possibility of mounting a device 10 as exemplified in FIG. 12 onto a support substrate S such as, e.g., printed circuit board—PCB with the device 10 e.g., arranged "upside-down", that is with the upper or top surface carrying the pads 121 facing towards the substrate S.

As exemplified, e.g., in FIG. 13, in those embodiments where the substrate 20 (e.g., thermally conductive material such as copper or aluminum) is left in place to facilitate thermal dissipation from the die or chip 12 the attachment layer 120 may include thermally conductive material to promote good thermal coupling of the die or chip 12 to the substrate 20.

FIG. 14 is exemplary of the possibility of providing a circuit 10 with extended heat-sink features. In one or more embodiments these may include the substrate 20 including a heat-dissipative material and/or a heat-dissipative material 200 providing a thermally conductive path extending between the upper or top surface of the die or chip 12 (pointing downwards with the device 10 mounted "upside-down") and the outer surface of the (secondary) molding mass 14.

In one or more embodiments, the heat-dissipative material 200 may be coupled with the die 12 via a heat-conductive material in a layer 122.

One or more embodiments may contemplate removing a (first) temporary or sacrificial layer 20 and substituting therefor a corresponding (second) layer including a high-dissipative heat sink material.

Figure 15:
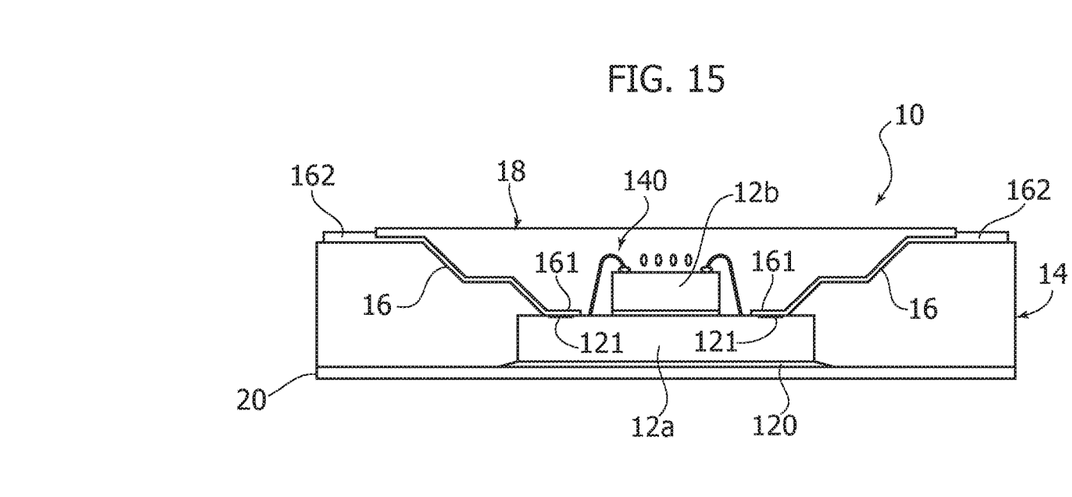

FIG. 15 is exemplary of the possibility, in one or more embodiments, to include plural dice or chips in a "stacked" arrangement including, e.g., a first chip or die 12a and a second chip or die 12b stacked thereon with the possible provision of a wire-bonding layout (of a known type) 140 providing electrical connection between the stacked dice as desired.

Figure 16:
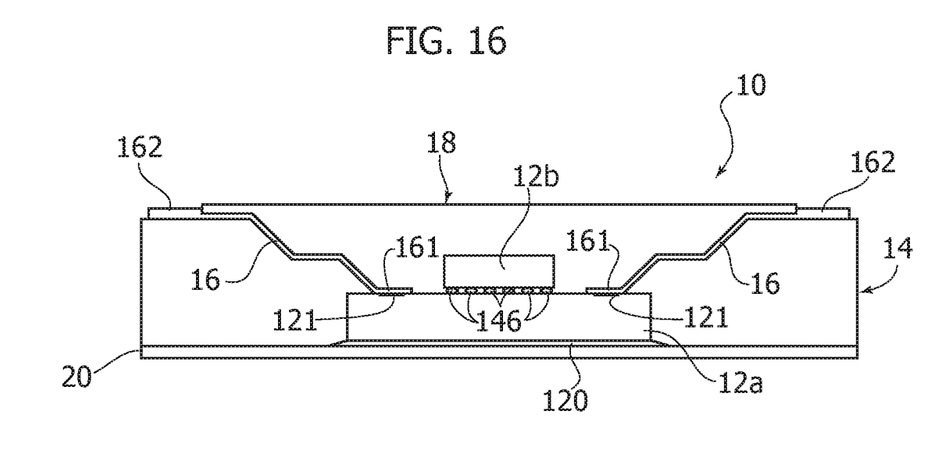

FIG. 16 is exemplary of another stacked arrangement wherein electrical connection between two stacked semiconductor dice 12a, 12b is provided by formations such as balls or bumps 142 (e.g., in a flip-chip arrangement) in the place of the wiring 140 of FIG. 15.

Figure 17:
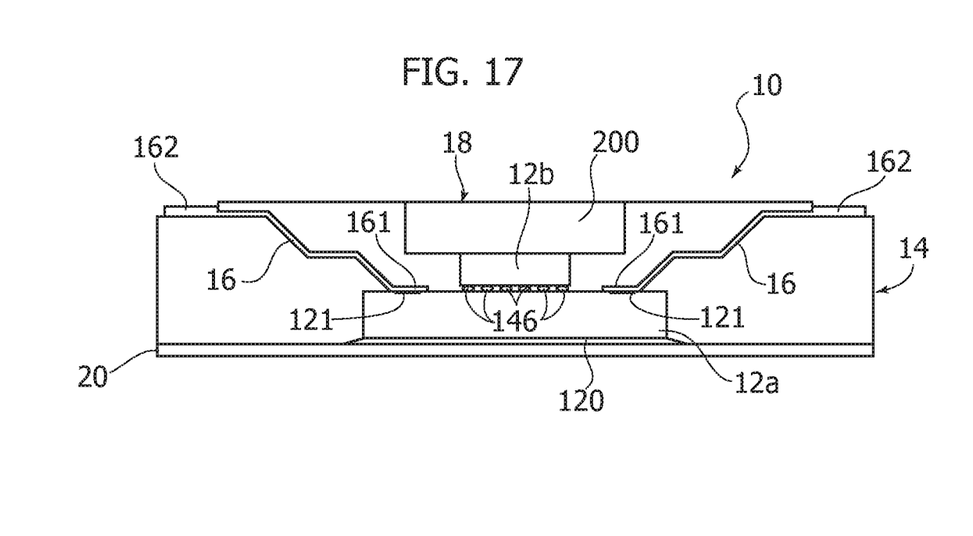

FIG. 17 is exemplary of the possibility of applying the enhanced heat-dissipation arrangement discussed previously in connection with FIG. 14 to an arrangement including stacked dice 12a, 12b.

It will be otherwise appreciated that possible variants of one or more embodiments are not limited to the embodiments exemplified in the figures: in one or more embodiments, features exemplified in connection with any one of the figures may be applied (singly or in combination) also to embodiments exemplified in any other of the figures.

Figure 18:
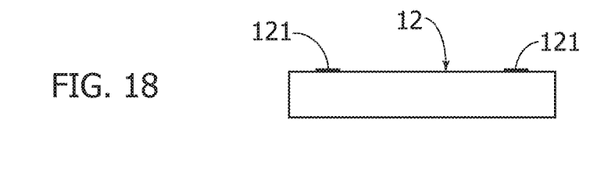
FIGS. 18 to 27 illustrate various stages of manufacturing of a semiconductor device in accordance with one embodiment.
Figure 19:
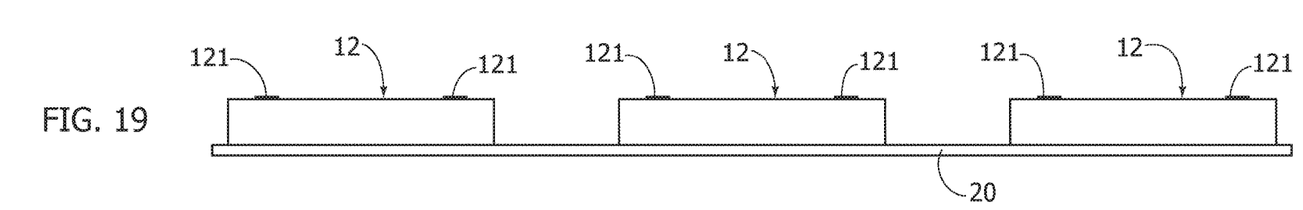
Figure 20:
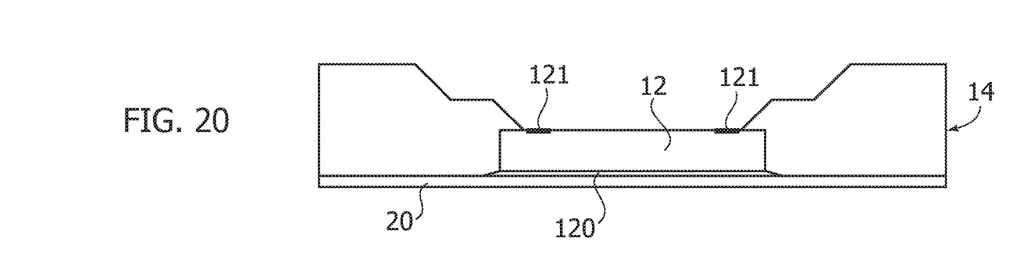
Figure 21:
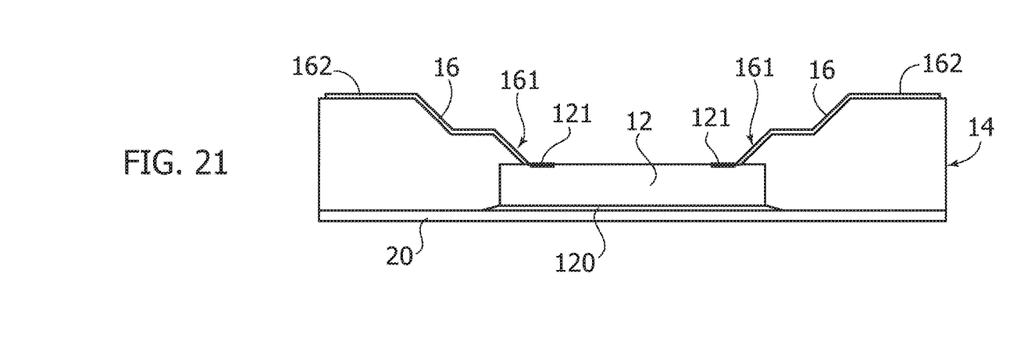

FIGS. 18 to 27 are exemplary of certain embodiments wherein the steps exemplified in FIGS. 18 to 20 are essentially the same as those previously discussed in connection with FIGS. 2 to 4: for the sake of brevity, a corresponding detailed description will not be repeated here.

In one or more embodiments as exemplified in FIGS. 18 to 27 the package material 14 may include a LDS (Laser Direct Structuring) material, such as a thermoplastic or thermoset polymer which can be activated by laser ablation.

In such embodiments, as a possible alternative to ink-printing as discussed previously, the electrically-conductive formations 16 may be provided by applying to the structure shown in FIG. 20 (and specifically to the recessed portion provided in the molding mass 14) LDS processing. This results in the formation of lasered traces in the activated material of the compound 14, with these traces including proximal and distal ends 161, 162 as discussed previously.

Figure 22:
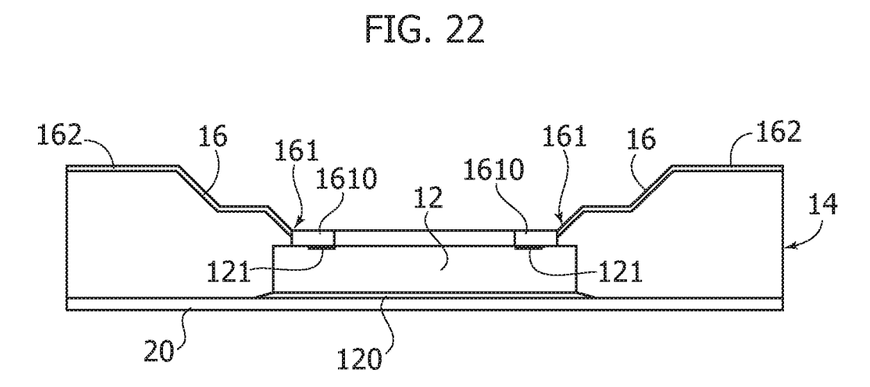

In so far as LDS processing primarily affects (only) the package mass 14, proximal contact ends 162 with the die pads 121 of the die or chip 12 can be, so-to-say, completed as exemplified in FIG. 22 by ink printing corresponding electrically conductive areas 1610 over the pads 121. These will overlap the lasered area on the wall of the recessed portion of the molding compound 14 thus facilitating electrical contact as desired.

Such an embodiment as presented herein is exemplary of the possibility of providing (e.g., by ink printing, electrochemical or galvanic deposition or the like) deposited formations providing electrical coupling of the "lasered" traces with the associated pads.

In one or more embodiments, an electrically-insulating layer 165 may be provided (e.g., by ink printing) at the top surface of the die or chip 12.

Figure 23:
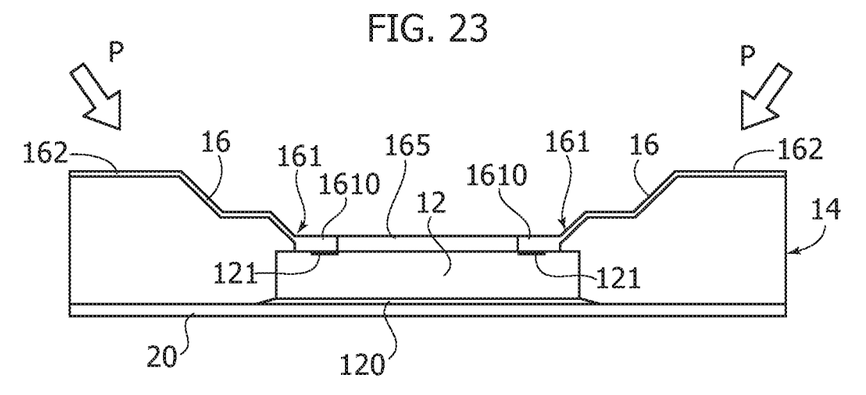
Figure 24:
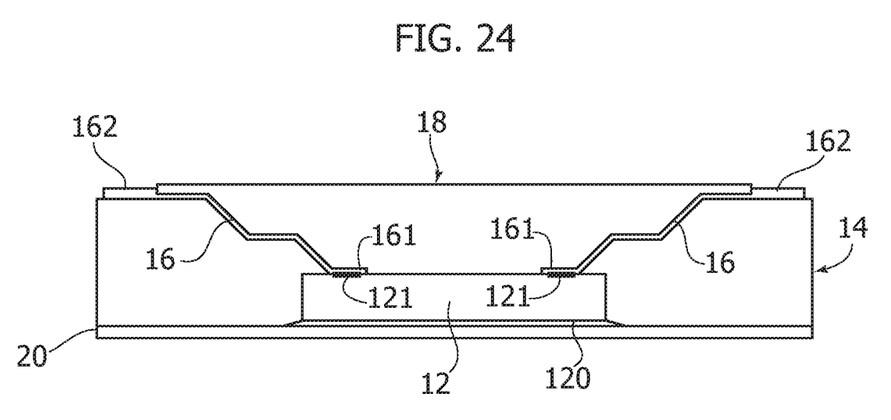
Figure 25:
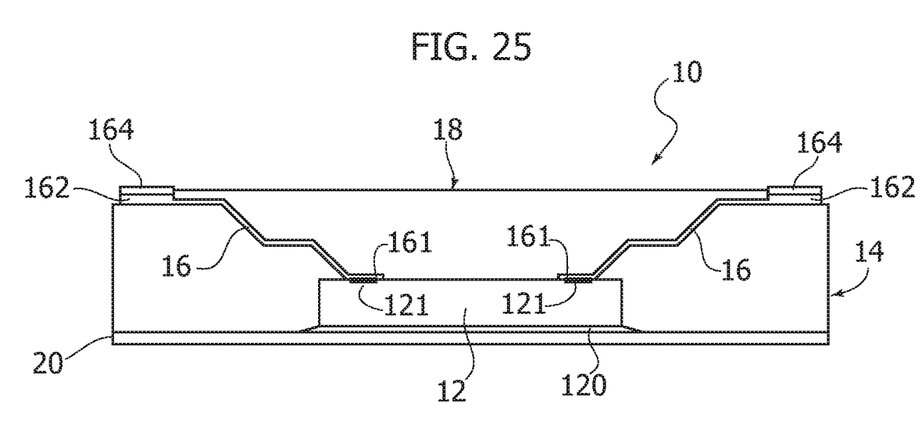

FIGS. 23 to 27 are exemplary of the possible completion of the structure as exemplified in FIG. 22 by, e.g.:

plating (e.g., electroless) P—FIG. 23;

filling of the cavity in package 14 with a (secondary) mass 18—FIG. 24;

plating (or ball formation) at the distal ends 162 of the formations 16—FIG. 25.

Figure 26:
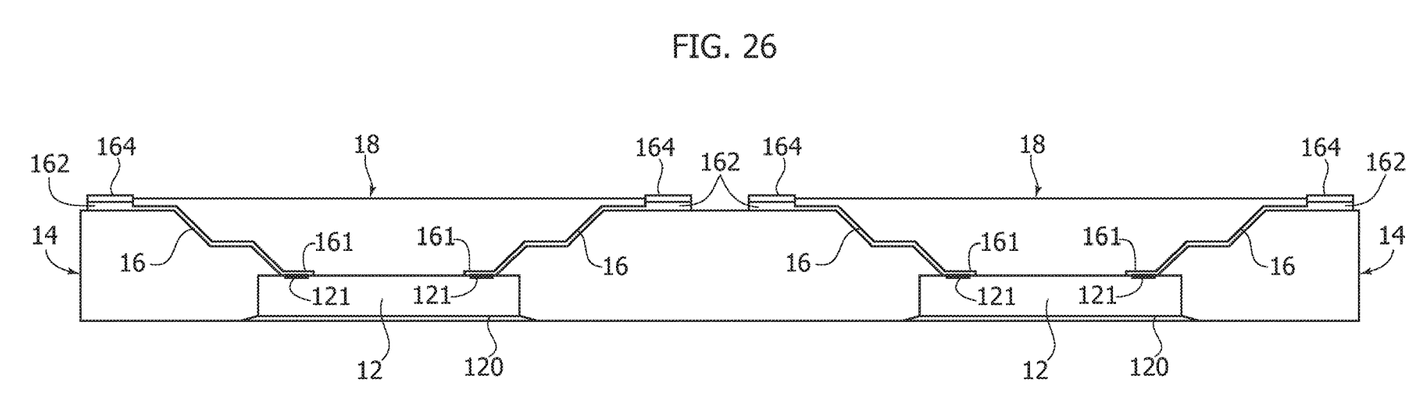
Figure 27:
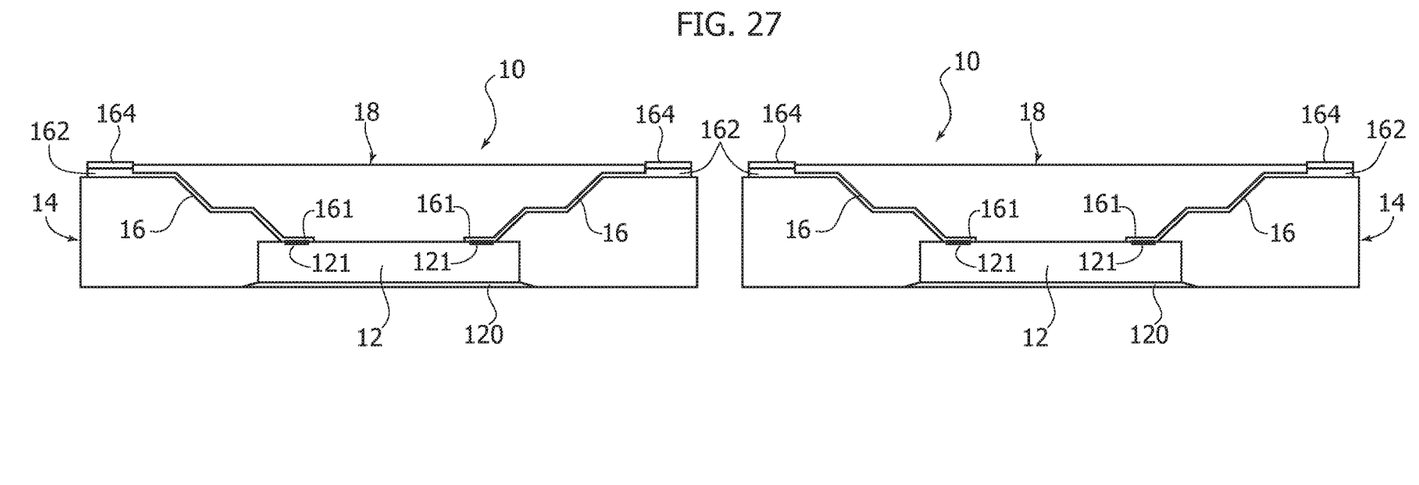

FIGS. 26 and 27 are exemplary of possible removal of the substrate 20 (if not left in place) and/or of simultaneous processing of plural dice or chips with subsequent singulation essentially as discussed previously in connection with FIGS. 9 and 10: a corresponding detailed description will not be repeated here for the sake of brevity.

A method according to one or more embodiments may include:

providing at least one semiconductor chip (e.g., 12) having a surface with electrical contact pads (e.g., 121), providing a package mass (e.g., 14) encapsulating the semiconductor chip, the package mass including a recessed portion leaving the surface with the contact pads exposed, the recessed portion having a peripheral wall extending from the surface of the semiconductor chip (12) to the outer surface of the package mass, and providing electrically-conductive formations (e.g., 16) extending over the peripheral wall and having proximal ends (e.g., 161) electrically coupled with the contact pads of the semiconductor chip and distal ends at the outer surface of the package mass.

One or more embodiments may include filling the recessed portion with a further package mass (e.g., 18) by leaving the distal ends of the electrically-conductive formations uncovered.

One or more embodiments may include providing the recessed portion with a flared, optionally stepped, peripheral wall.

In one or more embodiments providing the electrically-conductive formations may include ink-printing electrically-conductive formations over the peripheral wall of the recessed portion.

In one or more embodiments the package mass may include laser activatable material and providing the electrically-conductive formations may include laser activating the laser activatable material.

One or more embodiments may include depositing electrically-conductive material (e.g., 1610) at the proximal ends of the (laser activated) electrically-conductive formations to provide electrical coupling thereof with the contact pads of the semiconductor chip.

One or more embodiments may include at least one of:
plating (e.g., 164) the distal ends of the electrically-conductive formations, and/or
providing electrical contact formations (e.g., 166) at the distal ends of the electrically-conductive formations.

One or more embodiments may include providing heat-conductive material at least one of:
the surface with contact pads of the semiconductor chip (see, e.g., 200 in FIGS. 14 and 17), and/or
a surface of the semiconductor chip opposite the surface with the electrical contact pads (see, e.g., 20).

One or more embodiments may include:
attaching (e.g., 120) the least one semiconductor chip onto a support layer (e.g., 20) prior to providing the package mass and the electrically-conductive formations at the peripheral wall of the recessed portion, and
removing the support layer after providing the package mass and the electrically-conductive formations at the peripheral wall of the recessed portion.

One or more embodiments may include attaching the least one semiconductor chip onto a thermally conductive support layer prior to providing the package mass and the electrically-conductive formations at the peripheral wall of the recessed portion (with such thermally conductive support layer eventually left in place)

In one or more embodiments a semiconductor device may include:
at least one semiconductor chip having a surface with electrical contact pads,
a package mass encapsulating the semiconductor chip, the package mass including a recessed portion leaving the surface with the contact pads exposed, the recessed portion having a peripheral wall extending from the surface of the semiconductor chip to the outer surface of the package mass, and
electrically-conductive formations extending over the peripheral wall and having proximal ends electrically coupled with the contact pads of the semiconductor chip and distal ends at the outer surface of the package mass,
the device optionally manufactured with the method of one or more embodiments.

A circuit according to one or more embodiments may include:
a support substrate (e.g., S), and
at least one semiconductor device according to one or more embodiments arranged onto the support substrate.

In one or more embodiments may include the at least one semiconductor device arranged onto the support substrate with the surface with the contact pads facing towards the support substrate.

Without prejudice to the underlying principles, the details and embodiments may vary, even significantly, with respect to what has been described by way of example only without departing from the extent of protection. The various embodiments described above can be combined to provide further embodiments. These and other changes can be made to the embodiments in light of the above-detailed description. In general, in the following claims, the terms used should be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, including:
molding a laser activatable package mass around a semiconductor chip, the package mass including a recess portion, wherein electrical contact pads are located at a perimeter of the semiconductor chip and are exposed from the package mass by the recess portion, the recessed portion having a peripheral wall extending from the semiconductor chip to an outer surface of the package mass; and
forming laser activated electrically-conductive formations on the package mass, the electrically-conductive formations extending over the peripheral wall and having proximal ends electrically coupled with the contact pads of the semiconductor chip and distal ends at the outer surface of the package mass.

2. The method of claim 1, wherein the package mass is a first package mass, the method further comprising filling the recessed portion with a second package mass, wherein the distal ends of the electrically-conductive formations remain uncovered by the second package mass.

3. The method of claim 1, wherein the recessed portion has a flared or stepped peripheral wall.

4. The method of claim 1 wherein forming the electrically-conductive formations includes ink-printing electrically-conductive formations over the peripheral wall of the recessed portion.

5. The method of claim 1, further comprising depositing electrically-conductive material at the proximal ends of the electrically-conductive formations to electrically couple with the contact pads of the semiconductor chip.

6. The method of claim 1, further comprising at least one of:
plating the distal ends of the electrically-conductive formations; or
providing electrical contact formations at the distal ends of the electrically-conductive formations.

7. The method of claim 1, further comprising providing heat-conductive dissipative material at least one of:
the first surface of the semiconductor chip; or
a second surface of the semiconductor chip that is opposite the first surface.

8. The method of claim 1, further comprising:
attaching the semiconductor chip to a support layer prior to forming the package mass and forming the electrically-conductive formations, and
removing the support layer after forming the package mass and forming the electrically-conductive formations.

9. The method of claim 1, further comprising attaching the semiconductor chip onto a thermally conductive support layer prior to forming the package mass and forming the electrically-conductive formations.

10. A semiconductor device, comprising:
a semiconductor chip, the semiconductor chip including electrical contact pads at a perimeter of the semiconductor chip;
a laser activatable resin encapsulating the semiconductor chip, the laser activatable resin including a recessed portion at a central portion that exposes the contact pads at the perimeter of the semiconductor chip, the recessed portion formed by a peripheral wall extending from the perimeter of the semiconductor chip to an outer surface of the laser activatable resin; and laser activated electrically-conductive formations extending over the peripheral wall and having proximal ends electrically coupled with the contact pads of the semiconductor chip and distal ends at the outer surface of the laser activatable resin.

11. The semiconductor device of claim 10, wherein the semiconductor chip is coupled to a support substrate.

12. The semiconductor device of claim 11, wherein the semiconductor chip is arranged on the support substrate with the first surface facing towards the support substrate.

13. The semiconductor device of claim 10, wherein the electrically-conductive formations conform to a step of the recessed portions.

14. The semiconductor device of claim 10, wherein the semiconductor device includes a package molded mass filling the recessed portion.

15. A semiconductor package, comprising:
a semiconductor chip, the semiconductor chip including a plurality of electrical contact pads at a perimeter of the semiconductor chip;
a laser activatable resin encapsulating the semiconductor chip, the laser activatable resin forming lateral walls and a bottom surface of semiconductor package, the laser activatable resin including a stepped recessed portion that exposes the plurality of contact pads at the perimeter of the semiconductor chip; and
electrically-conductive formations that include laser activated resin on stepped recessed portion of the laser activatable resin and having proximal ends electrically coupled to the plurality of contact pads of the semiconductor chip and distal ends on the laser activatable resin.

16. The semiconductor package of claim 15, further comprising a package mass filling the stepped recess.

17. The semiconductor package of claim 16, wherein the package mass is laser activatable resin.

18. The semiconductor package of claim 16, wherein the laser activatable resin forms a first outer surface of the semiconductor package and the package mass forms a second outer surface of the semiconductor package, the second surface being opposite the first surface.

19. The semiconductor package of claim 15, wherein the electrically-conductive formations extend over the stepped recessed portion of the laser activatable resin.

* * * * *